(12) United States Patent
Tallam et al.

(10) Patent No.: US 9,294,005 B2
(45) Date of Patent: *Mar. 22, 2016

(54) METHOD AND APPARATUS FOR DETECTING AFE FILTER CAPACITOR DEGRADATION

(71) Applicants: Rangarajan Tallam, Germantown, WI (US); Russel Kerkman, Milwaukee, WI (US)

(72) Inventors: Rangarajan Tallam, Germantown, WI (US); Russel Kerkman, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 206 days.

This patent is subject to a terminal disclaimer.

(21) Appl. No.: 14/042,753

(22) Filed: Oct. 1, 2013

(65) Prior Publication Data

US 2015/0092460 A1 Apr. 2, 2015

(51) Int. Cl.
*H02M 5/45* (2006.01)
*H02M 7/12* (2006.01)
*G01R 31/02* (2006.01)
*H02M 5/452* (2006.01)
*H02M 5/458* (2006.01)
*G01R 31/42* (2006.01)

(52) U.S. Cl.
CPC ............. *H02M 7/125* (2013.01); *G01R 31/028* (2013.01); *H02M 5/452* (2013.01); *H02M 5/4585* (2013.01); *G01R 31/42* (2013.01)

(58) Field of Classification Search
CPC ....... H02M 5/40; H02M 5/45; H02M 5/4505; H02M 5/451; H02M 5/452; H02M 5/46; H02M 5/48; H02M 5/453; H02M 5/458
USPC .............. 363/34–37, 39, 40, 44–47, 123–131
See application file for complete search history.

(56) References Cited

U.S. PATENT DOCUMENTS

| | | | |
|---|---|---|---|
| 5,319,513 | A | 6/1994 | Lowenstein et al. |
| 5,491,725 | A | 2/1996 | White |
| 5,796,258 | A | 8/1998 | Yang |

(Continued)

FOREIGN PATENT DOCUMENTS

| | | |
|---|---|---|
| CN | 201393056 Y | 1/2010 |
| EP | 2299568 A1 | 3/2011 |

(Continued)

OTHER PUBLICATIONS

Lee et al., "A Robust, On-Line Turn-Fault Detection Technique for Induction Machines Based on Monitoring the Sequence Component Impedance Matrix", IEEE Transactions on Power Electronics, vol. 18, No. 3, May 2003, pp. 865-872.

(Continued)

*Primary Examiner* — Jeffrey Gblende
(74) *Attorney, Agent, or Firm* — Fay Sharpe LLP

(57) ABSTRACT

Methods and systems are disclosed for detecting capacitor degradation in an input filter of an active front end power conversion system in which voltage and current sensing is performed to determine sequence component impedance asymmetry to detect filter capacitor degradation according to the value of an off-axis admittance matrix component for Delta or Y-connected filter capacitor banks without sensitivity to voltage unbalance, and with the capability to identify particular degraded capacitor locations based on individual impedance values.

17 Claims, 8 Drawing Sheets

(56) References Cited

U.S. PATENT DOCUMENTS

| | | | |
|---|---|---|---|
| 5,804,973 | A | 9/1998 | Sinohara |
| 6,166,929 | A | 12/2000 | Ma et al. |
| 6,269,010 | B1 | 7/2001 | Ma et al. |
| 6,366,483 | B1 | 4/2002 | Ma et al. |
| 6,525,951 | B1 | 2/2003 | Paice |
| 6,642,689 | B2 | 11/2003 | Ishida et al. |
| 7,274,576 | B1 | 9/2007 | Zargari et al. |
| 7,495,410 | B2 | 2/2009 | Zargari et al. |
| 7,495,938 | B2 | 2/2009 | Wu et al. |
| 7,511,976 | B2 | 3/2009 | Zargari et al. |
| 7,616,005 | B2 | 11/2009 | Kalyuzhny et al. |
| 7,683,568 | B2 | 3/2010 | Pande et al. |
| 7,764,523 | B2 | 7/2010 | Conticelli et al. |
| 7,782,009 | B2 * | 8/2010 | Wiseman .................. 318/801 |
| 7,786,735 | B2 | 8/2010 | Kalyuzhny et al. |
| 7,800,348 | B2 | 9/2010 | Zargari |
| 7,812,615 | B2 | 10/2010 | Gajic et al. |
| 7,990,097 | B2 | 8/2011 | Cheng et al. |
| 8,009,450 | B2 | 8/2011 | Royak et al. |
| 8,030,791 | B2 | 10/2011 | Lang et al. |
| 8,044,631 | B2 | 10/2011 | Dai et al. |
| 8,183,874 | B2 | 5/2012 | Dommaschk |
| 8,259,426 | B2 | 9/2012 | Xiao et al. |
| 8,259,480 | B2 | 9/2012 | Hasler |
| 8,350,397 | B2 | 1/2013 | Lang et al. |
| 8,352,203 | B2 | 1/2013 | Seibel et al. |
| 8,395,910 | B2 | 3/2013 | Alexander |
| 8,400,800 | B2 | 3/2013 | Alexander |
| 8,587,160 | B2 | 11/2013 | Dai et al. |
| 8,729,844 | B2 | 5/2014 | Feng et al. |
| 2001/0017489 | A1 | 8/2001 | Inoue et al. |
| 2004/0257093 | A1 | 12/2004 | Sakiyama |
| 2009/0072982 | A1 | 3/2009 | Cheng et al. |
| 2010/0161259 | A1 | 6/2010 | Kim et al. |
| 2011/0292696 | A1 * | 12/2011 | Xiao et al. .................. 363/37 |
| 2012/0271572 | A1 | 10/2012 | Xiao |
| 2013/0057297 | A1 | 3/2013 | Cheng |
| 2013/0076151 | A1 * | 3/2013 | Bae et al. .................. 307/82 |
| 2013/0120038 | A1 | 5/2013 | Kerkman et al. |
| 2013/0120039 | A1 | 5/2013 | Kerkman et al. |
| 2013/0279214 | A1 * | 10/2013 | Takase et al. .................. 363/37 |
| 2013/0286692 | A1 | 10/2013 | Patel et al. |
| 2014/0217980 | A1 | 8/2014 | Malrieu |
| 2014/0320056 | A1 | 10/2014 | Royak |
| 2015/0092460 | A1 | 4/2015 | Tallam |
| 2015/0155794 | A1 | 6/2015 | Long |
| 2015/0241503 | A1 | 8/2015 | Bhandarkar |
| 2015/0263600 | A1 | 9/2015 | Bhandarkar et al. |

FOREIGN PATENT DOCUMENTS

| | | |
|---|---|---|
| EP | 2 390 997 A2 | 11/2011 |
| EP | 2660962 A2 | 11/2013 |
| FR | 2980053 | 3/2011 |
| WO | WO2012010353 A1 | 1/2012 |
| WO | WO2012044727 A1 | 4/2012 |
| WO | WO2012110088 A1 | 8/2012 |

OTHER PUBLICATIONS

ABB Bay Control REC670 Application manual, Relion 670 series, http://www05./abb.com/global/scot/scot354.nsf, Oct. 10, 2011, pp. 1-586 (2 parts).
Transformer protection RET670 ANSI Application manual, Relion 670 series, http://www.abb.com/product/db0003db004281/c12573e700330419c/257f000263ad5.aspx#!, May 6, 2011, pp. 1-864 (2 parts).
"Protective Relays", iCP-630 Capacitor Bank Protection Relay, Cooper Power Systems, Jan. 2011, pp. 1-8.
ABB Distribution Automation Handbook, Section 8.10 Protection of Capacitor Banks, Mar. 5, 2011.
GE C70 Capacitor Bank Protection and Control System UR Series Instruction Manual C70 Revision: 6.0x, Copyright @ 2011, GE Multilin, http://www.GEmultilin.com, pp. 1-644 (2 parts).
"iCP-630 Capacitor Bank Protection Relay", Cooper Power Systems, Mar. 2007.
U.S. Appl. No. 13/570,781, "Filter Capacitor Degradation Detection Apparatus and Method", by Patel et al., filed Aug. 9, 2012.
U.S. Appl. No. 13/872,177, "Active Front End Filter Capacitor Failure Prediction With Y and Delta Capacitor Connection", by Royak et al., filed Apr. 29, 2013.
Rodriguez-Valdez, et al., "Phase Locked Loop for Unbalanced Utility Conditions", 2010 Applied Power Electronics Conference and Exposition (APEC), 2010 25th Annual IEEE 2010, Piscataway, NJ, Feb. 21, 2010, pp. 634-641.
European Search Report completed Jul. 20, 2015 for Application No. EP 15 15 6270.
European Search Report, Appl. No. EP141873430.0, Mailed Feb. 25, 2015, Completed Feb. 18, 2015; Munich, DE; 4 pgs.

* cited by examiner

METHOD AND APPARATUS FOR DETECTING AFE FILTER CAPACITOR DEGRADATION

BACKGROUND

Power conversion systems convert input electrical power from one form to another for driving a load. Motor drives and other power conversion systems operate using power from AC power sources, and typically include an input filter to reduce switching noise associated with operation of the power converter, and particularly to control total harmonic distortion (THD) generated by high frequency operation of certain active front end (AFE) rectifiers. In particular, many power conversion systems utilize inductor-capacitor (LC) or inductor-capacitor-inductor (LCL) input filter circuitry associated with each AC input phase to control the harmonic content of a connected power grid. Such filter circuits are subject to damage or degradation of the filter capacitors, such as by voltage surges. Filter capacitor degradation, in turn, may be costly in terms of replacement component costs, labor for inspection and replacement, as well as downtime for the power conversion system and any associated machinery. Previously, assessing the performance and any degradation in the input filter capacitors has been difficult, and initial capacitor degradation may not be identifiable by visual inspection by service personnel. Accordingly, improved filter capacitor degradation prediction or detection apparatus and techniques are desirable for detecting degradation and identifying degrading capacitors in active front end power converters.

SUMMARY

One or more aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter. The present disclosure provides power converters and techniques for automatic detection of degrading filter circuit capacitors, finding particular utility in association with motor drives and other power conversion systems employing AFE rectifiers.

One or more aspects of the present disclosure involve power conversion systems having an active front end rectifier and an input filter circuit, as well as methods and a degradation detection system that employ measured currents and voltages associated with the filter circuit in order to detect degrading filter capacitors by a vector or phasor technique. In one implementation, the degradation detection system computes fundamental frequency current and voltage phasors based on the measured currents and voltages, and computes sequence current and voltage component phasors based on the fundamental frequency phasors. The system further computes an off-diagonal filter circuit admittance matrix term, for example, representing the effect of positive sequence voltage on negative sequence current in the input filter circuit, based on the sequence current and voltage component phasors, and the detection system compares the off-diagonal term to a threshold to detect degradation of one or more filter capacitors. The detection system in certain implementations selectively offsets the off-diagonal term or terms according to a predetermined nominal asymmetry value. In certain embodiments, moreover, the system also determines individual impedance values for the filter capacitors, and can identify a specific degrading filter capacitor location based on the corresponding determined impedance value, according to whether the filter capacitor bank is delta-connected or Y-connected.

In accordance with further aspects of the disclosure, systems and methods are provided in which input filter capacitor degradation is detected using scalar computations, in which an effective neutral voltage value and an effective current value are computed using measured voltages and currents, respectively, and nominal effective values for the effective neutral voltage and effective current are computed. An effective current fault value is computed based on the nominal effective current value, an estimated admittance value, and the nominal effective neutral voltage value, and the result is compared to a threshold to selectively detect degradation of one or more filter capacitors.

In accordance with further aspects of the present disclosure, computer readable mediums are provided with computer executable instructions for performing the filter capacitor degradation detection methods.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
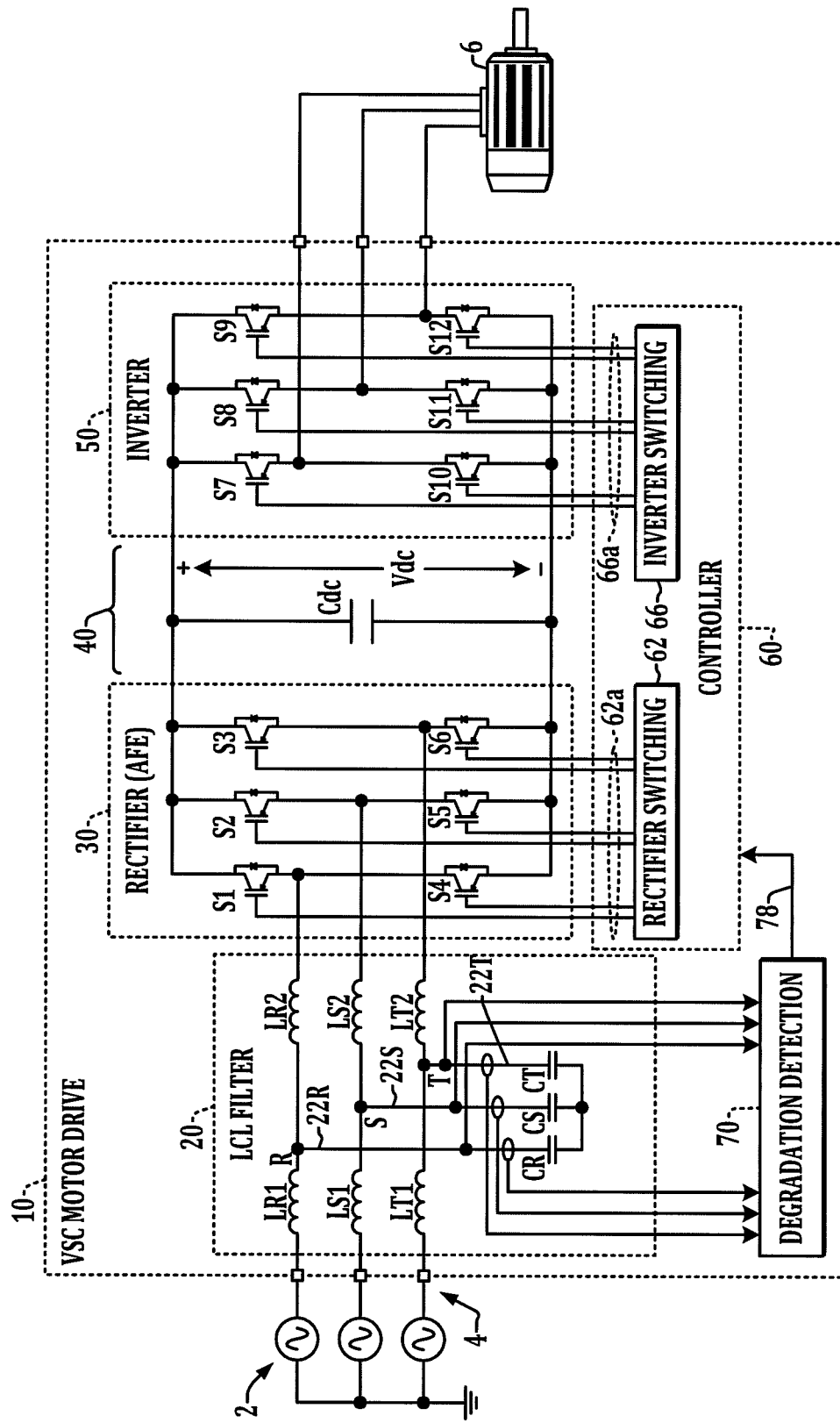
FIG. 1 is a schematic diagram illustrating an exemplary voltage source converter active front end motor drive with an LCL input filter including Y-connected filter capacitors and a filter capacitor degradation detection apparatus in accordance with one or more aspects of the present disclosure.

Referring now to the figures, several embodiments or implementations are hereinafter described in conjunction with the drawings, wherein like reference numerals are used to refer to like elements throughout, and wherein the various features are not necessarily drawn to scale. Techniques and apparatus are disclosed for detection of degradation in power conversion system filter capacitors, which find utility in association with active front end (AFE) motor drives as well as other forms of power conversion systems. In addition, although illustrated in the context of three-phase input devices, the disclosed concepts can be employed in power conversion systems having any number of input phases in which an input filter includes at least one delta or Y-connected filter capacitor circuit or bank. In addition, the concepts of the present disclosure may be employed in connection with voltage source converters as well as current source converters.

Figure 2:
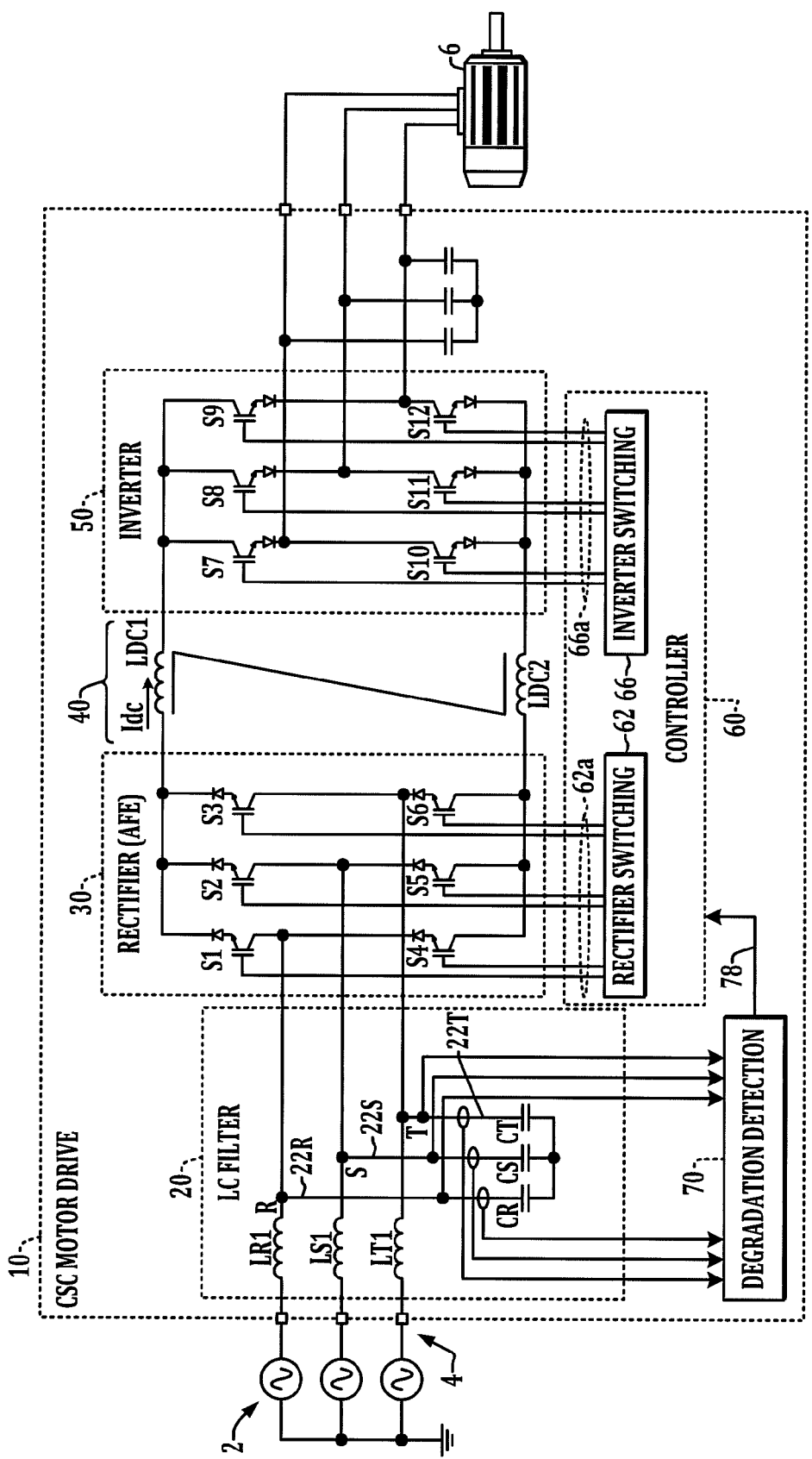
FIG. 2 is a schematic diagram illustrating an exemplary current source converter type active front end motor drive with an LC input filter and a filter capacitor degradation detection apparatus in accordance with the present disclosure.

Referring initially to FIGS. 1 and 2, FIG. 1 illustrates an exemplary voltage source converter (VSC) motor drive 10 with a three-phase AC input 4 receiving input power from a three-phase source 2, where the drive 10 includes a rectifier 30, an intermediate DC link circuit 40 and an output inverter 50 providing variable frequency, variable amplitude AC output power to drive a motor load 6. FIG. 2 illustrates a current source converter (CSC) type motor drive 10, wherein the DC link circuit 40 in the VSC converter of FIG. 1 includes a DC link capacitance Cdc providing a controlled DC voltage Vdc, and the CSC converter of FIG. 2 provides a DC link choke or inductance LDC1, LDC2 for providing a controlled DC link current Idc to the inverter 50. Although illustrated and described in the context of motor drive type power conversion systems 10, the various disclosed concepts can be employed in other forms of power conversion systems, whether providing an AC output or a DC output to drive a motor or other type of load 6. As seen in FIGS. 1 and 2, the drive input 4 has three input phase terminals connected through an LCL input filter circuit 20 to the AC input of the switching (active front end) rectifier 30. The rectifier 30 includes switching devices S1-S6 individually coupled between a corresponding one of the AC input phases (R, S, T) and a corresponding DC bus terminal (+ or −) of the DC link circuit 40. A drive controller 60 includes a rectifier switching controller 62 providing rectifier switching control signal 62a to the rectifier switches S1-S6 to cause the rectifier 30 to convert received three-phase AC input power to provide a DC voltage Vdc across the DC bus capacitance Cdc of the link circuit 40 (FIG. 1) or to provide a controlled DC link current Idc (FIG. 2) using any suitable pulse width modulation (PWM) technique.

The inverter 50 receives DC input power from the link circuit 40 and includes inverter switches S7-S12 individually coupled between one of the positive or negative DC link output terminals and a corresponding output phase connected to the motor load 6. The inverter switches S7-S12 are operated according to inverter switching control signals 66a provided by an inverter switching component 66 of the drive controller 60, which generates the signals 66a according to any suitable pulse width modulation technique to convert DC power from the link circuit 40 to provide variable frequency, variable amplitude AC output power to the motor load 6. The switching rectifier 30 and the inverter 50 may employ any suitable form of switching devices S1-S12 including without limitation insulated gate bipolar transistors (IGBTs), silicon controlled rectifiers (SCRs), gate turn-off thyristors (GTOs), integrated gate commutated thyristors (IGCTs), etc. The controller 60 and the switching control components 62, 66 thereof may be implemented using any suitable processor-based circuitry, including without limitation one or more processing elements and associated electronic memory operated according to program instructions to implement the various functions set forth herein and other motor control functions as are known. In addition, the motor drives 10 of FIGS. 1 and 2 further include a degradation detection system or apparatus 70, which may be implemented using one or more processors configured or programmed using suitable computer-executable instructions to implement the filter capacitor degradation detection and location identification functions described herein. In certain implementations, moreover, the degradation detection system 70 may be implemented using one or more processors of the motor drive controller 60, although not a strict requirement of all the aspects of the present disclosure.

Figure 3:
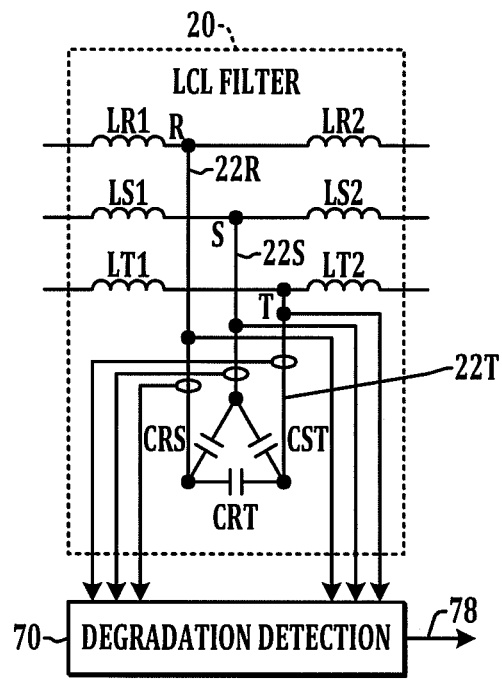
FIGS. 3 and 4 are schematic diagrams illustrating the degradation detection apparatus in conjunction with LCL and LC filter circuits having delta-connected filter capacitors, respectively.
Figure 4:
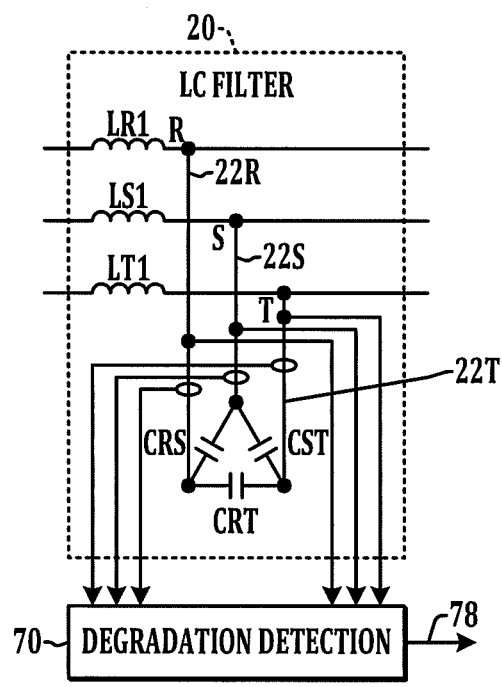

The VSC converter 10 of FIG. 1 includes an LCL filter circuit 20 with three series circuits individually connected between the power converter input 4 and the corresponding phase of the rectifier AC input. Each series circuit in this LCL filter structure includes a pair of series-connected filter inductors (LR1 and LR2 in the "R" line; LS1 and LS2 in the "S" line; and LT1 and LT2 in the "T" line), with the first circuit including inductor $L_i1$ (e.g., a 3% inductor) connected between the first power converter input terminal and a first intermediate node (R, S, or T), as well as a second filter inductor $L_i2$ (e.g., a 9% inductor) connected between the intermediate node and a corresponding rectifier AC input node. In addition, the filter circuit 20 in FIGS. 1 and 2 includes three capacitor circuit branches 22R, 22S and 22T respectively connecting the nodes R, S and T to a "Y" configuration of three filter capacitors CR, CS and CT. FIGS. 3 and 4 illustrate LCL and LC filter circuits in which the filter capacitors CRS, CST and CRT are delta-connected, with each filter capacitor connected to two of the capacitor circuit branches 22 as shown. Moreover, the VSC converter 10 in FIG. 1 employs an LCL filter circuit 20, whereas the CSC examples (FIGS. 2 and 4) employ LC filter circuits 20 as shown. In practice, one or more transformers (not shown) may be provided between the active front and rectifier 30 and the power source 2.

The motor drives 10 in FIGS. 1-4 include a degradation detection system 70 coupled with the filter circuit 20, as well as sensing circuitry which senses line-to-line voltages $V_{RS}$, and $V_{ST}$, and which may be connected to measure $V_{RT}$, for example, by sensing the voltages at the branch circuits 22 as illustrated. In other implementations, the voltages at the input side of the filter 20 may be sensed. In addition, the sensing circuit includes current sensors coupled to the branch circuits 22 to sense the filter circuit branch currents $I_R$, $I_S$ and $I_T$ flowing in the associated capacitor circuit branches 22R, 22S and 22T. The degradation detection system 70 can be any suitable hardware, processor-executed software, processor-executed firmware, programmable logic, analog circuitry, etc. which provides the described computations and degradation determination and location identification functionality as set forth herein, and may be operative using one or more processor elements executing computer executable instructions stored in an electronic memory of the system 70.

Figure 5:
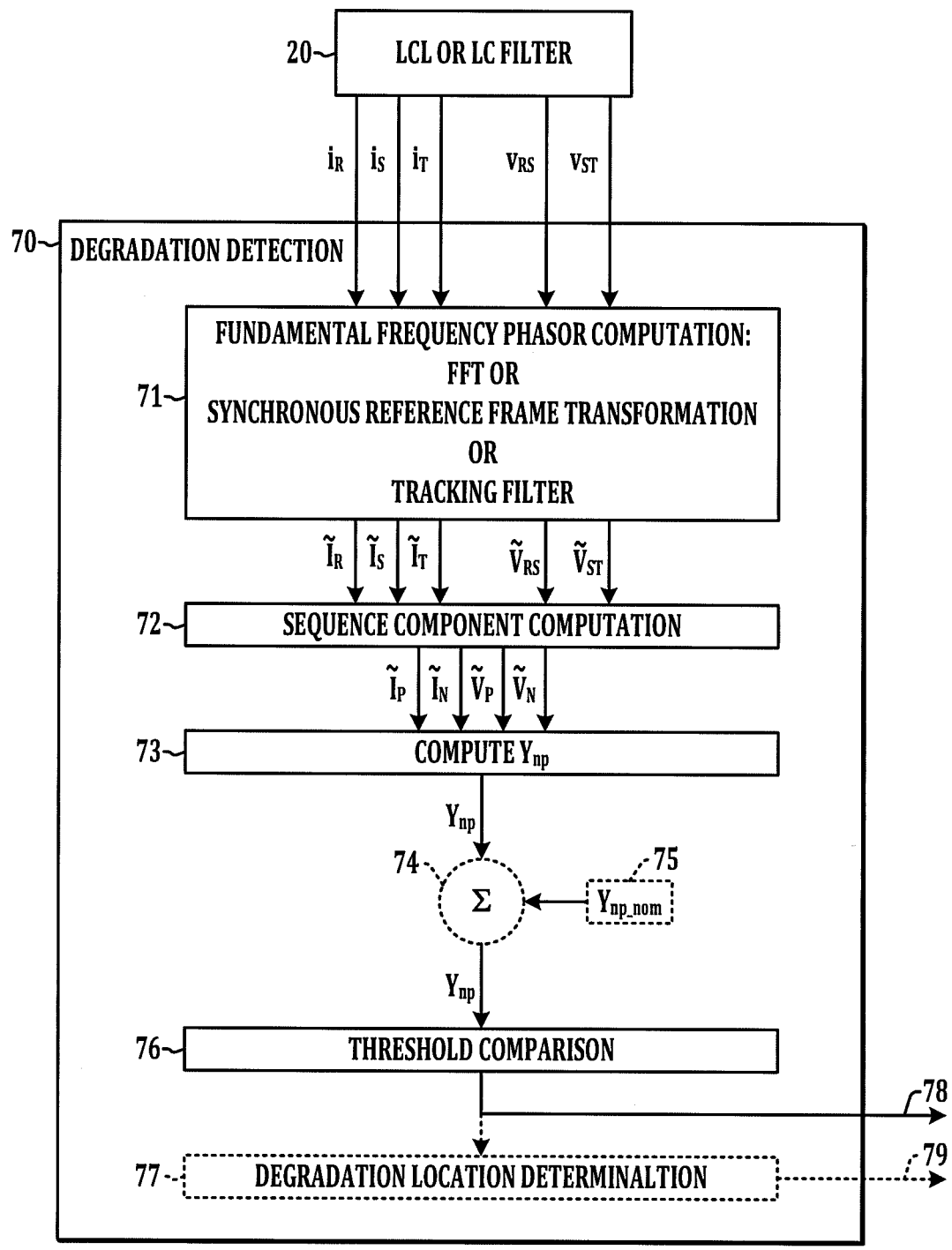
FIG. 5 is a simplified diagram illustrating further details of the degradation detection apparatus of FIGS. 1-4.
Figure 6:
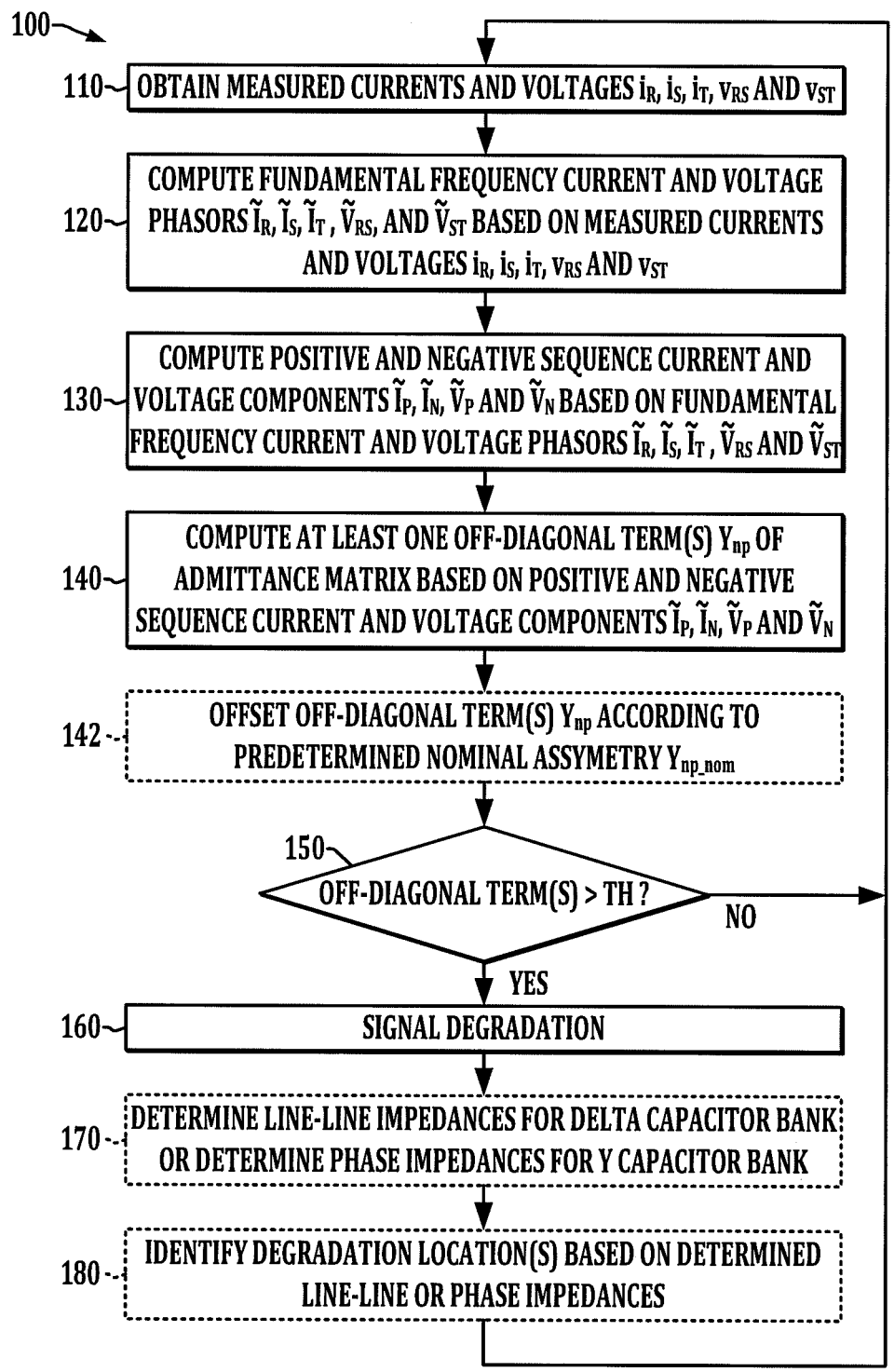
FIG. 6 is a flow diagram illustrating an exemplary vector or phasor-based process for detecting filter capacitor degradation in a power converter according to various aspects of the present disclosure.
Figure 7:
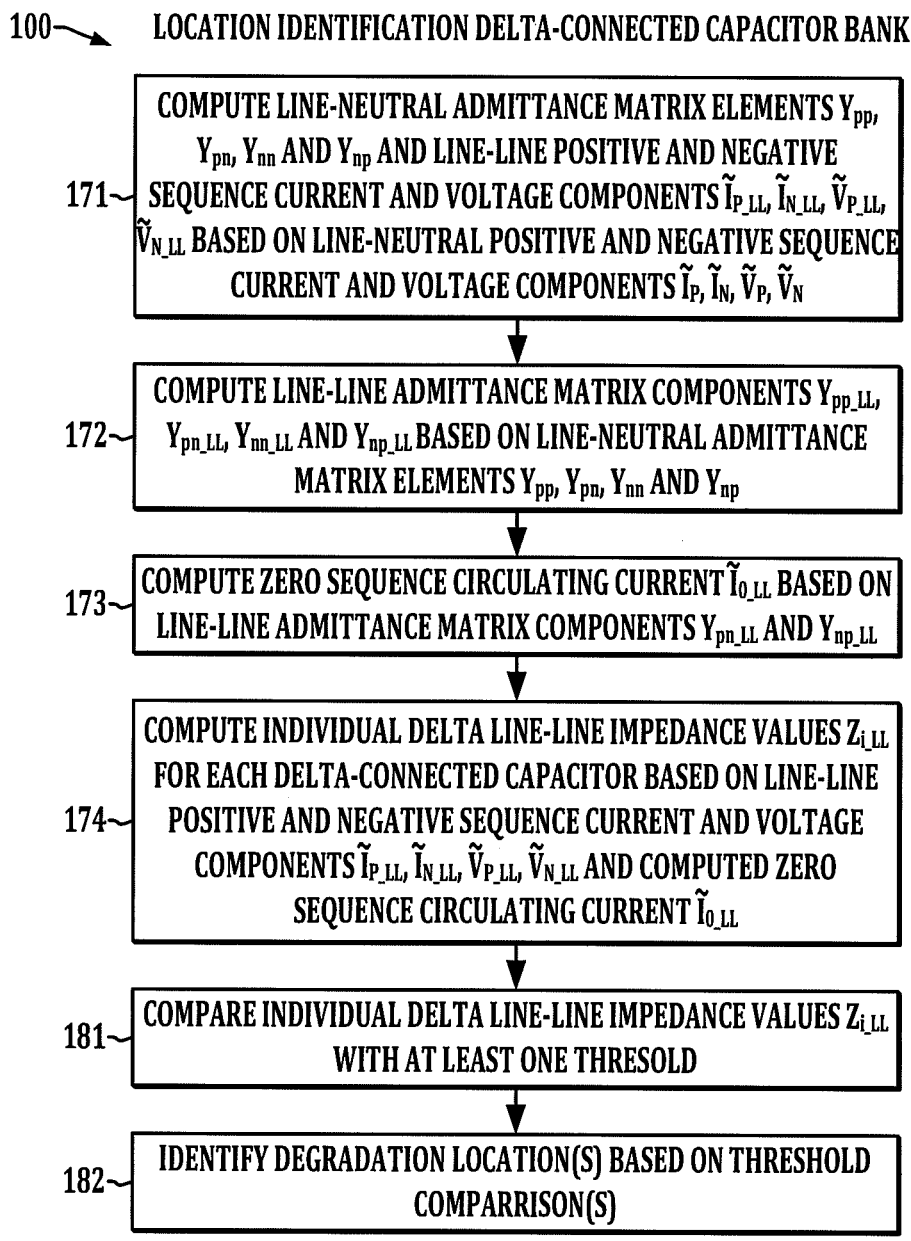
FIG. 7 is a flow diagram illustrating an exemplary technique for identifying filter capacitor degradation location in a delta-connected capacitor bank using the method of FIG. 6.
Figure 8:
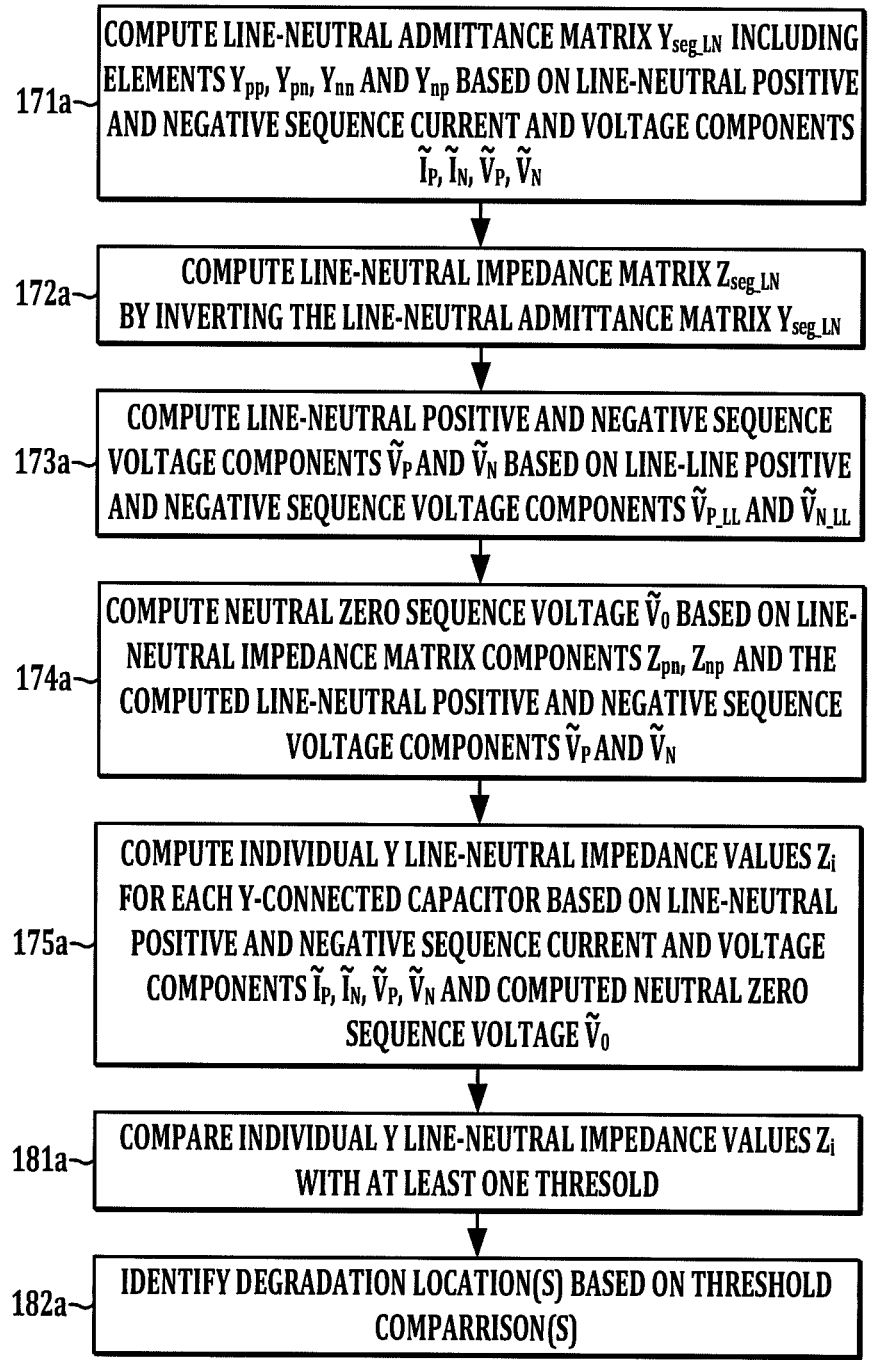
FIG. 8 is a flow diagram illustrating a technique for identifying the location of one or more degrading capacitors in a Y-connected filter capacitor bank via the method of FIG. 6.

Referring also to FIGS. 5-8, the degradation detection system 70 is operatively coupled with the input filter circuit 20 and with the sensing system to receive one or more measured currents (e.g., $i_R$, $i_S$, $i_T$) and measured voltages (e.g., $v_{RS}$, $v_{ST}$) associated with the input filter circuit 20, and based on these, to selectively detect filter capacitor degradation conditions. The system 70 in certain embodiments optionally identifies specific location(s) of one or more degraded capacitors CR, CS, CT in the filter circuit 20 according to the measured values. FIG. 5 illustrates further details of an exemplary embodiment of the capacitor degradation detection system 70, and FIG. 6 illustrates an exemplary phasor-based process 100 for detecting filter capacitor degradation in the input filter 20, which may be implemented using the degradation detection system 70. FIGS. 7 and 8 illustrate further techniques in the process 100 for identifying the location or locations of degraded capacitors for Delta and Y-connected filter bank configurations, respectively.

As seen in FIG. 5, the degradation detection system 70 may include one or more components 71-77, which may be implemented as software and/or firmware components in execution, programmable logic, etc. as described further below. One embodiment of the degradation detection system 70 includes a fundamental frequency phasor computation component 71, that may be implemented as processor-executed fast Fourier transform (FFT) routines, or as a synchronous reference frame transformation computation, or as a tracking filter or other suitable techniques by which fundamental frequency current and voltage phasors are computed at least partially according to measured currents and voltages. In one possible implementation, for example, the phasor computation component 71 receives measured filter branch currents $i_R$, $i_S$ and $i_T$ as well as line-line voltages $v_{RS}$ and $v_{ST}$ (at 110 in the process 100 of FIG. 6). Based on these, the phasor computation component 71 computes fundamental frequency current and voltage phasors $\tilde{I}_R$, $\tilde{I}_S$, $\tilde{I}_T$, $\tilde{V}_{RS}$ and $\tilde{V}_{ST}$ (120 in FIG. 6). Any suitable computational techniques can be employed by the system 70 in computing the fundamental frequency phasor values at 120 based on the instantaneous measured values. Beginning with the measured current and voltage values (e.g., $i_R$, $i_S$, $i_T$, $v_{RS}$ and $v_{ST}$), the fundamental frequency phasor computation component 71 in FIG. 5 constructs the fundamental frequency phasors $\tilde{I}_R$, $\tilde{I}_S$, $\tilde{I}_T$, $\tilde{V}_{RS}$ and $\tilde{V}_{ST}$ in one embodiment according to the following equations (1):

$$v_{RS}, v_{ST} \to \begin{bmatrix} \tilde{V}_{RS} \\ \tilde{V}_{ST} \end{bmatrix}$$

$$i_{RST} \to \begin{bmatrix} \tilde{I}_R \\ \tilde{I}_S \\ \tilde{I}_T \end{bmatrix} \tag{1}$$

As seen in FIG. 5, moreover, detection system 70 further includes a sequence component computation component 72, which computes positive and negative sequence current and voltage component phasors $\tilde{I}_p$, $\tilde{I}_n$, $\tilde{V}_p$ and $\tilde{V}_n$ (at 130 and FIG. 6) based on the computed fundamental frequency phasors $\tilde{I}_R$, $\tilde{I}_S$, $\tilde{I}_T$, $\tilde{V}_{RS}$ and $\tilde{V}_{ST}$ using any suitable computational techniques. In certain embodiments, the sequence current and voltage component phasors are computed by the component 72 according to the following equations (2)-(5):

$$T = \frac{1}{3}\begin{bmatrix} 1 & a & a^2 \\ 1 & a^2 & a \end{bmatrix}, a = e^{j\frac{2\pi}{3}} \tag{2}$$

$$\begin{bmatrix} \tilde{V}_{P\_LL} \\ \tilde{V}_{N\_LL} \end{bmatrix} = T \begin{bmatrix} \tilde{V}_{RS} \\ \tilde{V}_{ST} \\ -(\tilde{V}_{RS} + \tilde{V}_{ST}) \end{bmatrix} \tag{3}$$

$$\begin{bmatrix} \tilde{I}_P \\ \tilde{I}_N \end{bmatrix} = T \begin{bmatrix} \tilde{I}_R \\ \tilde{I}_S \\ \tilde{I}_T \end{bmatrix}$$

$$\tilde{V}_P = \frac{1}{\sqrt{3}} e^{-j\frac{\pi}{6}} \tilde{V}_{P\_LL} \tag{4}$$

$$\tilde{V}_N = \frac{1}{\sqrt{2}} e^{j\frac{\pi}{6}} \tilde{V}_{N\_LL} \tag{5}$$

The inventors have appreciated that the sequence components of voltages and currents at the fundamental frequency are related by an admittance matrix, in which the off-diagonal terms are a measure of asymmetry in the impedance of the filter circuit 20. The elements of the admittance matrix are complex numbers. For example, a column vector of the positive and negative current sequence components $\tilde{I}_p$ and $\tilde{I}_n$ are found by multiplying a 2×2 admittance matrix having upper row elements $Y_{pp}$ and $Y_{pn}$ and lower row elements $Y_{np}$ and $Y_{nn}$ by a column vector of the positive and negative voltage sequence components $\tilde{V}_p$ and $\tilde{V}_n$, as shown in equation (6) below:

$$\begin{bmatrix} \tilde{I}_P \\ \tilde{I}_N \end{bmatrix} = \begin{bmatrix} Y_{pp} & Y_{pn} \\ Y_{np} & Y_{nn} \end{bmatrix} \begin{bmatrix} \tilde{V}_P \\ \tilde{V}_N \end{bmatrix} \tag{6}$$

Accordingly, the diagonal admittance matrix terms $Y_{pp}$ and $Y_{nn}$ (representing the effect of positive sequence voltage on positive sequence current, and the effect of negative sequence voltage on negative sequence current, respectively) are generally equal for an ideal balanced capacitor bank, while the off-diagonal terms $Y_{pn}$ and $Y_{np}$ are zero. When the capacitor bank of the filter 20 becomes unbalanced (e.g., due to degradation of one or more of the filter capacitors), the off-diagonal terms $Y_{np}$ and $Y_{pn}$ become non-zero, and may be used to measure the degree of degradation. By using the impedance asymmetry for diagnosing capacitor degradation, the disclosed degradation detection systems 70 and process 100 are not sensitive to voltage unbalance, etc. For pure capacitance, moreover, the absolute value of the off-diagonal terms are equal ($Y_{pn} = -Y_{np}^*$; hence, $|Y_{np}| = |Y_{pn}|$).

An admittance matrix computation component 73 (FIG. 5) uses at least some of the negative sequence phasors to compute one or more components of a filter circuit admittance matrix (140 in FIG. 6). In certain embodiments, for instance, one or both of the off-diagonal terms $Y_{np}$ and $Y_{pn}$ is computed by the component 73, such as computation of $Y_{np}$ of the filter circuit admittance matrix based on at least one of the computed positive and negative sequence current and voltage component phasors $\tilde{I}_p$, $\tilde{I}_n$, $\tilde{V}_p$ and $\tilde{V}_n$, where the computed value $Y_{np}$ represents the effect of positive sequence voltage $\tilde{V}_p$ on negative sequence current $\tilde{I}_n$ in the input filter circuit 20. In certain embodiments, $Y_{np}$ can be estimated from the measured current and voltage sequence components in the following equations (7)-(10), wherein the effect of $\tilde{V}_n$ on $\tilde{I}_p$ may be ignored in certain implementations as generally $\tilde{V}_p \gg \tilde{V}_n$ and $|Y_{pn}| < |Y_{pp}|$:

$$\tilde{I}_p = Y_{pp}\tilde{V}_p + Y_{pn}\tilde{V}_n \tag{7}$$

$$\tilde{I}_n = Y_{np}\tilde{V}_p + Y_{nn}\tilde{V}_n \tag{8}$$

$$\hat{Y}_{nn} = \frac{\tilde{I}_p}{\tilde{V}_p} \tag{9}$$

-continued $$\hat{Y}_{np} = \frac{\tilde{I}_n - \frac{\tilde{I}_p}{\tilde{V}_p}\tilde{V}_n}{\tilde{V}_p} \quad (10)$$

In certain implementations, $Y_{np}$ can instead be computed using the following equations (11)-(14), for example, if $\tilde{V}_n$ cannot be ignored:

$$\tilde{I}_p = Y_{pp}\tilde{V}_p + Y_{pn}\tilde{V}_n \quad (11)$$

$$\tilde{I}_n = Y_{np}\tilde{V}_p + Y_{nn}\tilde{V}_n \quad (12)$$

$$Y_{pn} = -Y_{np}^* \quad (13)$$

$$\begin{bmatrix} Y_{pp\_re} \\ Y_{pp\_im} \\ Y_{np\_re} \\ Y_{np\_im} \end{bmatrix} = \begin{bmatrix} V_{p\_re} & -V_{p\_im} & -V_{n\_re} & -V_{n\_im} \\ V_{p\_im} & V_{p\_re} & -V_{n\_im} & V_{n\_re} \\ V_{n\_re} & -V_{n\_im} & V_{p\_re} & -V_{p\_im} \\ V_{n\_im} & V_{n\_re} & V_{p\_im} & V_{p\_re} \end{bmatrix}^{-1} \begin{bmatrix} I_{p\_re} \\ I_{p\_im} \\ I_{n\_re} \\ I_{n\_im} \end{bmatrix} \quad (14)$$

In this case, the matrix equation (14) can be used to obtain the real and imaginary components $Y_{np\_re}$ and $Y_{np\_im}$, and the value of $Y_{np}$ can be obtained as $Y_{np}=Y_{np\_re}+jY_{np\_im}$.

In certain implementations, there may be inherent asymmetry in the capacitor bank of the filter circuit 20. The degradation detection system 70 in one implementation provides a predetermined nominal asymmetry value 75 ($Y_{np\_nom}$) which is subtracted from the computed value $Y_{np}$ using a summer 74 (FIG. 5) to offset the off-diagonal term $Y_{np}$ at 142 in FIG. 6, although the offsetting is not a strict requirement of all implementations of the degradation detection systems and methods of the present disclosure. The inherent asymmetry, moreover, can be optionally compensated in certain embodiments by calculating or otherwise providing a nominal value of $Y_{np}$ ($Y_{np\_nom}$) and subtracting this from the estimated off-diagonal term $Y_{np}$ as seen in the following equation (15).

$$\hat{Y}_{np} = \frac{\tilde{I}_n - \frac{\tilde{I}_p}{\tilde{V}_p}\tilde{V}_n}{\tilde{V}_p} - Y_{np\_nom} \quad (15)$$

Moreover, this nominal value can be updated, for example, if all the filter capacitors age or degrade together identically, then the magnitude of the term $Y_{pp}=Y_{nn}$ can be used to detect the change from the nominal value. This technique, moreover, is insensitive to line voltage unbalance or control loop parameters of the active rectifier 30.

A threshold comparison component 76 (FIG. 5) compares one or both of the off-diagonal admittance matrix terms (e.g., $Y_{np}$) to at least one associated threshold value (determination 150 and FIG. 6), and the system 70 may provide a detection output signal or value 78 indicating that degradation of one or more of the filter capacitors has been detected if the off-diagonal term exceeds the threshold (YES at 150 in FIG. 6). In the threshold comparisons disclosed herein, a single threshold can be used, and the comparison may determine whether the compared value exceeds an upper threshold, or falls below a lower threshold, or the threshold comparison may involve a range defined by two threshold values, with the degradation detection determination being made when the compared value falls outside the range defined by the two threshold values. Otherwise (NO at 150), the process 100 in FIG. 6 returns to obtain subsequently measured currents and voltages at 110. In one implementation, the degradation detection signal 78 may be provided to the motor drive controller 60 as shown in FIGS. 1 and 2 above, to initiate one or more actions, such as shutting down the motor drive 10 and/or providing an alert or warning signal or other indication, for instance, to a user interface associated with the motor drive 10 and/or to a connected network (not shown).

In certain implementations, moreover, the degradation detection system 70 in FIG. 5 also includes a degradation location determination component 77, which operates to determine individual impedance values for the plurality of filter capacitors (at 170 in FIG. 6) and to identify at least one particular filter capacitor (CR, CS and/or CT) as being suspected of degradation (180 in FIG. 6) based on the corresponding determined impedance value. As seen in FIG. 5, moreover, the location determination component 77 may provide a location message or indication 79, for example, to a user interface of the motor drive or to a connected network to notify users or service personnel of the suspected location of the degraded capacitor(s).

As previously noted, AFE drives typically employ LC or LCL filters 20 to attenuate high-frequency currents on the AC input line, and the filter capacitors CR, CS and/or CT in FIGS. 1 and 2 (or the Delta-connected capacitors in FIGS. 3 and 4) are often exposed to transient conditions. The filter capacitors, moreover, are typically metallized film components, and may suffer from insulation breakdown when exposed to voltage surges. While these devices are generally self-healing, the capacitance value typically decreases with each breakdown event. In addition, high voltage devices made by series connection of multiple capacitors in each capacitor bank branch may suffer from increased capacitance if one or more sections breakdown and/or short out. Moreover, dielectric breakdown can result from other issues, such as partial discharge, etc.

The presently disclosed techniques and systems advantageously facilitate detection of capacitor degradation at an early stage to allow remedial measures prior to catastrophic failure. In addition, the techniques of the present disclosure advantageously allow capacitor degradation detection using currently measured values in the motor drive 10. For example, the capacitor currents (e.g., $i_R$, $i_S$ and $i_T$ in FIGS. 1-4 above) are typically measured for control purposes, such as in providing active damping for AFE drives. Also, capacitor voltages (e.g., line-line voltages $v_{RS}$ and $v_{ST}$) are used in the motor drive 10 to synchronize to the AC line and/or the voltage on the grid side of the filter circuit 120 may be measured for synchronization. The present disclosure thus may not require addition of any hardware, and employs the current and voltage measurements associated with a filter circuit 120 for diagnostic purposes. Moreover, the degradation detection techniques of the present disclosure may be used in association with LCL filters commonly used with VSC type converters (e.g., FIGS. 1 and 3 above) as well as with LC filters commonly found in current source drives 10 (e.g., FIGS. 2 and 4). Furthermore, the capacitor degradation may be detected using the above described phasor-based process 100 in the system 70 for both Y-connected implementations (FIGS. 1 and 2) as well as with delta-connected capacitor banks (FIGS. 3 and 4).

Referring also to FIG. 7, for a delta-connected filter capacitor bank (e.g., FIGS. 3 and 4), the determination of the line-line impedances at 170 in FIG. 6, as well is the identification of the degradation location(s) at 180 can be implemented as follows in certain embodiments. In this implementation, the detection system 70 computes line-neutral admittance matrix elements $Y_{pp}$, $Y_{nn}$, $Y_{np}$ and $Y_{pn}$ and line-line positive and negative sequence current and voltage component phasors $\tilde{I}_{p\_LL}$, $\tilde{I}_{n\_LL}$, $\tilde{V}_{p\_LL}$ and $\tilde{V}_{n\_LL}$ at 171 in FIG. 7 based on line-neutral positive and negative sequence current and voltage component phasors $\tilde{I}_p$, $\tilde{I}_n$, $\tilde{V}_p$ and $\tilde{V}_n$ per the following equations (16)-(18):

$$\begin{bmatrix} \tilde{I}_p \\ \tilde{I}_n \end{bmatrix} = \begin{bmatrix} Y_{pp} & Y_{pn} \\ Y_{np} & Y_{nn} \end{bmatrix} \begin{bmatrix} \tilde{V}_p \\ \tilde{V}_n \end{bmatrix} = Y_{seq\_LN} \begin{bmatrix} \tilde{V}_p \\ \tilde{V}_n \end{bmatrix} \quad (16)$$

$$\begin{bmatrix} \tilde{V}_{p\_LL} \\ \tilde{V}_{n\_LL} \end{bmatrix} = \sqrt{3} \begin{bmatrix} e^{j\pi/6} & 0 \\ 0 & e^{-j\pi/6} \end{bmatrix} \begin{bmatrix} \tilde{V}_p \\ \tilde{V}_n \end{bmatrix} \quad (17)$$

$$\begin{bmatrix} \tilde{I}_{p\_LL} \\ \tilde{I}_{n\_LL} \end{bmatrix} = \frac{1}{\sqrt{3}} \begin{bmatrix} e^{j\pi/6} & 0 \\ 0 & e^{-j\pi/6} \end{bmatrix} \begin{bmatrix} \tilde{I}_p \\ \tilde{I}_n \end{bmatrix} \quad (18)$$

In addition, line-line admittance matrix components $Y_{pp\_LL}$, $Y_{nn\_LL}$, $Y_{np\_LL}$ and $Y_{pn\_LL}$ are computed at 172 based on the line-neutral admittance matrix components $Y_{pp}$, $Y_{nn}$, $Y_{np}$ and $Y_{pn}$ according to the following equation (19):

$$\begin{bmatrix} Y_{pp\_LL} & Y_{pn\_LL} \\ Y_{np\_LL} & Y_{nn\_LL} \end{bmatrix} = \frac{1}{3} \begin{bmatrix} Y_{pp} & e^{j\pi/3} Y_{pn} \\ e^{-j\pi/3} Y_{np} & Y_{nn} \end{bmatrix} \quad (19)$$

At 173 in FIG. 7, the degradation detection system 70 computes a zero sequence circulating current phasor $\tilde{I}_{0\_LL}$ representing the zero sequence current circulating within the delta-connected capacitor bank of the filter circuit 20 based on at least some of the line-line admittance matrix components $Y_{pp\_LL}$, $Y_{nn\_LL}$, $Y_{np\_LL}$ and $Y_{pn\_LL}$ per the relationships set forth in the following equations (20)-(25), in which the subscripts "a", "b", and "c" are used to denote the phases "R", "S" and "T" shown in FIGS. 1-4 above, and in which the scaling factor "a" of equation (22) is computed as $a = e^{(j2\pi/3)}$:

$$\begin{bmatrix} \tilde{I}_{ab} \\ \tilde{I}_{bc} \\ \tilde{I}_{ca} \end{bmatrix} = \begin{bmatrix} j\omega C_{ab} & 0 & 0 \\ 0 & j\omega C_{bc} & 0 \\ 0 & 0 & j\omega C_{ca} \end{bmatrix} \begin{bmatrix} \tilde{V}_{ab} \\ \tilde{V}_{bc} \\ \tilde{V}_{ca} \end{bmatrix} \quad (20)$$

$$\begin{bmatrix} \tilde{I}_{p\_LL} \\ \tilde{I}_{n\_LL} \\ \tilde{I}_{0\_LL} \end{bmatrix} = Y_{seq\_LL} \begin{bmatrix} \tilde{V}_{p\_LL} \\ \tilde{V}_{n\_LL} \end{bmatrix} \quad (21)$$

$$Y_{seq\_LL} = \frac{1}{3} \begin{bmatrix} 1 & a & a^2 \\ 1 & a^2 & a \\ 1 & 1 & 1 \end{bmatrix} \begin{bmatrix} j\omega C_{ab} & 0 & 0 \\ 0 & j\omega C_{bc} & 0 \\ 0 & 0 & j\omega C_{ca} \end{bmatrix} \begin{bmatrix} 1 & 1 & 1 \\ a^2 & a & 1 \\ a & a^2 & 1 \end{bmatrix} \quad (22)$$

$$Y_{seq\_LL} = \frac{1}{3} j\omega \begin{bmatrix} C_{ab} + C_{bc} + C_{ca} & C_{ab} + a^2 C_{bc} + a C_{ca} \\ C_{ab} + a C_{bc} + a^2 C_{ca} & C_{ab} + C_{bc} + C_{ca} \\ C_{ab} + a^2 C_{bc} + a C_{ca} & C_{ab} + a C_{bc} + a^2 C_{ca} \end{bmatrix} \quad (23)$$

$$\begin{bmatrix} \tilde{I}_{p\_LL} \\ \tilde{I}_{n\_LL} \end{bmatrix} = \begin{bmatrix} Y_{pp\_LL} & Y_{pn\_LL} \\ Y_{np\_LL} & Y_{nn\_LL} \end{bmatrix} \begin{bmatrix} \tilde{V}_{p\_LL} \\ \tilde{V}_{n\_LL} \end{bmatrix}, Y_{pn\_LL} = -Y^*_{np\_LL} \quad (24)$$

$$\tilde{I}_{0\_LL} = Y_{pn\_LL} \tilde{V}_{p\_LL} + Y_{np\_LL} \tilde{V}_{n\_LL} \quad (25)$$

In the delta-connected filter capacitor bank situation, the system 70 obtains the same line-line voltages and capacitor circuit branch current measurements, in which the line-line voltage is also the voltage across a corresponding one of the delta-connected capacitors, but the measured capacitor currents going into the capacitor bank are not the actual currents flowing in the individual filter capacitors. The system 70 uses the above equations (20)-(25) to estimate the actual current flowing in the filter capacitors for the delta configuration.

At 174 in FIG. 7, the system 70 computes the line-line impedance value $Z_{a\_LL} = \tilde{V}_{a\_LL}/\tilde{I}_{a\_LL}$ for each line-line location using the computed circulating current phasor $\tilde{I}_{0\_LL}$ according to the following equations (26)-(28):

$$\tilde{I}_{a\_LL} = \tilde{I}_{p\_LL} + \tilde{I}_{n\_LL} + \tilde{I}_{0\_LL} \quad (26)$$

$$\tilde{V}_{a\_LL} = \tilde{V}_{p\_LL} + \tilde{V}_{n\_LL} \quad (27)$$

$$Z_{a\_LL} = \tilde{V}_{a\_LL}/\tilde{I}_{a\_LL} \quad (28)$$

A corresponding line-line impedance value is computed at 174 in FIG. 7 for the other two phases "b" and "c" using formula similar to equations (26)-(28), except that $\tilde{I}_{p\_LL}$ and $\tilde{V}_{p\_LL}$ are multiplied by $a^2$, and $\tilde{I}_{n\_LL}$ and $\tilde{V}_{n\_LL}$ are multiplied by a in equations (26) and (27) in computing $Z_{b\_LL}$ for phase "b", and $\tilde{I}_{p\_LL}$ and $\tilde{V}_{p\_LL}$ are multiplied by a, and $\tilde{I}_{n\_LL}$ and $\tilde{V}_{n\_LL}$ are multiplied by $a^2$ in equations (26) and (27) in computing $Z_{c\_LL}$ for phase "c".

At 180 in FIG. 7, the system 70 identifies at least one particular filter capacitor as being suspected of degradation by computing the individual delta line-line impedance values $Z_{a\_LL}$, $Z_{b\_LL}$ and $Z_{c\_LL}$ with at least one threshold value at 181, and identifying at least one of the filter capacitors as being suspected of degradation at 182 if the corresponding impedance value exceeds the threshold. As previously mentioned, multiple thresholds can be used to determine whether the line-line impedance value falls outside an acceptable range, and/or a single threshold can be used (upper or lower, where the compared value transitioning below a lower value is deemed to "exceed the threshold" as used herein). In this regard, the computed impedance values $Z = 1/C\omega$, so if the nominal value of a given filter capacitor is known, the threshold(s) can be set to determine whether the capacitor has deviated significantly from the nominal value, and if so, identify this as the degraded capacitor.

Referring now to FIG. 8, in the case of a Y-connected capacitor bank, the measured filter circuit capacitor bank branch current is the line current (representing the actual current through the associated capacitor), but the measured voltage (line-line) is not the voltage across any individual capacitor. At 171a, a line-neutral admittance matrix ($Y_{seq\_LN}$ including elements $Y_{pp}$, $Y_{nn}$, $Y_{np}$, $Y_{pn}$) is computed by the system 70 based on line-neutral positive and negative sequence current and voltage component phasors $\tilde{I}_p$, $\tilde{I}_n$, $\tilde{V}_p$ and $\tilde{V}_n$ according to the following equation (29):

$$\begin{bmatrix} \tilde{I}_p \\ \tilde{I}_n \end{bmatrix} = \begin{bmatrix} Y_{pp} & Y_{pn} \\ Y_{np} & Y_{nn} \end{bmatrix} \begin{bmatrix} \tilde{V}_p \\ \tilde{V}_n \end{bmatrix} = Y_{seq\_LN} \begin{bmatrix} \tilde{V}_p \\ \tilde{V}_n \end{bmatrix} = Z^{-1}_{seq\_LN} \begin{bmatrix} \tilde{V}_p \\ \tilde{V}_n \end{bmatrix} \quad (29)$$

At 172a, a line-neutral impedance matrix $Z_{seq\_LN}$ is computed by inverting the line-neutral admittance matrix $Y_{seq\_LN}$ ($Z_{seq\_LN} = Y^{-1}_{seq\_LN}$), and line-neutral positive and negative sequence voltage component phasors $\tilde{V}_p$ and $\tilde{V}_n$ are computed at 173a based online-line positive and negative sequence voltage component phasors $\tilde{V}_{p\_LL}$ and $\tilde{V}_{n\_LL}$ according to the following equation (30):

$$\begin{bmatrix} \tilde{V}_{p\_LL} \\ \tilde{V}_{n\_LL} \end{bmatrix} = \sqrt{3} \begin{bmatrix} e^{j\pi/6} & 0 \\ 0 & e^{-j\pi/6} \end{bmatrix} \begin{bmatrix} \tilde{V}_p \\ \tilde{V}_n \end{bmatrix} \quad (30)$$

At 174a in FIG. 8, a neutral zero sequence voltage phasor $\tilde{V}_0$ is computed based on at least some line-neutral impedance matrix components ($Z_{pn}$, $Z_{np}$) and the computed line-neutral positive and negative sequence voltage component phasors $\tilde{V}_p$ and $\tilde{V}_n$, according to the following equations (31)-(36), again using the subscripts "a", "b", and "c" for the phases "R", "S" and "T", wherein the factor "a" in equation (30) is given by $a=e^{(j2\pi/3)}$:

$$\begin{bmatrix} \tilde{V}_{an} \\ \tilde{V}_{bn} \\ \tilde{V}_{cn} \end{bmatrix} = \begin{bmatrix} 1/j\omega C_a & 0 & 0 \\ 0 & 1/j\omega C_b & 0 \\ 0 & 0 & 1/j\omega C_c \end{bmatrix} \begin{bmatrix} \tilde{I}_a \\ \tilde{I}_b \\ \tilde{I}_c \end{bmatrix} \quad (31)$$

$$\begin{bmatrix} \tilde{V}_p \\ \tilde{V}_n \\ \tilde{V}_0 \end{bmatrix} = Z_{seq} \begin{bmatrix} \tilde{I}_p \\ \tilde{I}_n \end{bmatrix} \quad (32)$$

$$Z_{seq} = \frac{1}{3}\frac{1}{j\omega}\begin{bmatrix} 1/C_a+1/C_b+1/C_c & 1/C_a+a^2/C_b+a/C_c \\ 1/C_a+a/C_b+a^2/C_c & 1/C_a+1/C_b+1/C_c \\ 1/C_a+a^2/C_b+a/C_c & 1/C_a+a/C_b+a^2/C_c \end{bmatrix} \quad (33)$$

$$\begin{bmatrix} \tilde{I}_p \\ \tilde{I}_n \end{bmatrix} = \begin{bmatrix} Y_{pp} & Y_{pn} \\ Y_{np} & Y_{nn} \end{bmatrix}\begin{bmatrix} \tilde{V}_p \\ \tilde{V}_n \end{bmatrix}, \quad (34)$$

$$\begin{bmatrix} Y_{pp} & Y_{pn} \\ Y_{np} & Y_{nn} \end{bmatrix} = \begin{bmatrix} Z_{pp} & Z_{pn} \\ Z_{np} & Z_{nn} \end{bmatrix}^{-1}$$

$$Z_{pn} = -Z_{np}^*, \quad Y_{pn} = -Y_{np}^* \quad (35)$$

$$\tilde{V}_0 = Z_{pn}\tilde{V}_p + Z_{np}\tilde{V}_n \quad (36)$$

At 175a in FIG. 8, individual Y line-neutral impedance values $Z_a$ are computed for at least some of the filter capacitors based on the line-neutral positive and negative sequence current and voltage component phasors ($\tilde{I}_p$, $\tilde{I}_n$, $\tilde{V}_p$, $\tilde{V}_n$) and the computed neutral zero sequence voltage phasor $\tilde{V}_0$ according to the following equations (37)-(39):

$$\tilde{V}_a = \tilde{V}_p + \tilde{V}_n + \tilde{V}_0 \quad (37)$$

$$\tilde{I}_a = \tilde{I}_p + \tilde{I}_n \quad (38)$$

$$Z_a = \tilde{V}_a/\tilde{I}_a \quad (39)$$

It is noted that the above equations (37)-(39) show the relationships for computing the impedance value for phase "a", wherein similar equations are used for computing the corresponding phase impedances for phases "b" and "c", except that $\tilde{V}_p$ and $\tilde{I}_p$ are multiplied by $a^2$, and $\tilde{V}_n$ and $\tilde{I}_n$ are multiplied by a in equations (37) and (38) in computing $Z_b$ for phase "b", and $\tilde{V}_p$ and $\tilde{I}_p$ are multiplied by a, and $\tilde{V}_n$ and $\tilde{I}_n$ are multiplied by $a^2$ in equations (37) and (38) in computing $Z_C$ for phase "c".

At 180 in FIG. 8, the system 70 identifies the location of at least one particular filter capacitor suspected of degradation. In the illustrated embodiment, this involves comparing the individual Y line-neutral impedance values with at least one threshold value at 181a, and identifying at least one of the filter capacitors as being suspected of degradation at 182a if the corresponding Y line-neutral impedance value exceeds the threshold.

As seen above, the vector or phasor-based approach of FIGS. 6-8 allows expeditious detection of filter capacitor degradation (160 and FIG. 6), as well as the ability to calculate the true phase-phase (delta) or phase (Y) impedances for fault diagnosis to identify the location of a degrading capacitor in the filter circuit 20. Moreover, for either delta or Y-connected filter banks, only the line currents and line-line voltages need to be measured, whereby the various concepts of the present disclosure can be implemented in existing motor drives and other power conversion systems without addition of any new hardware. The inventors have appreciated that while the negative sequence current through the capacitor bank can be used in other approaches as a fault indicator, it is sensitive to unbalance in the voltage. In particular, the negative-sequence current is a vector sum of the contributions due to capacitor bank asymmetry and voltage unbalance, and it is possible that the negative-sequence current may decrease in magnitude during a fault condition due to voltage unbalance (as opposed to actual capacitor degradation). Moreover, the inventors have appreciated that the response of an active rectifier 30 to voltage unbalance is also a function of control loop bandwidths during operation of the power converter 10, in particular the current regulator, and thus the magnitude of negative-sequence current through the capacitors of the filter circuit 20 may be affected by the control loops of the AFE rectifier 30. In this regard, the AFE rectifier 30 could either regulate the line currents to be of positive sequence only (resulting in high second harmonic ripple on DC bus 40) or regulate the DC bus 40 to attenuate second harmonic ripple on the DC bus (resulting in unbalanced line currents).

Figure 9:
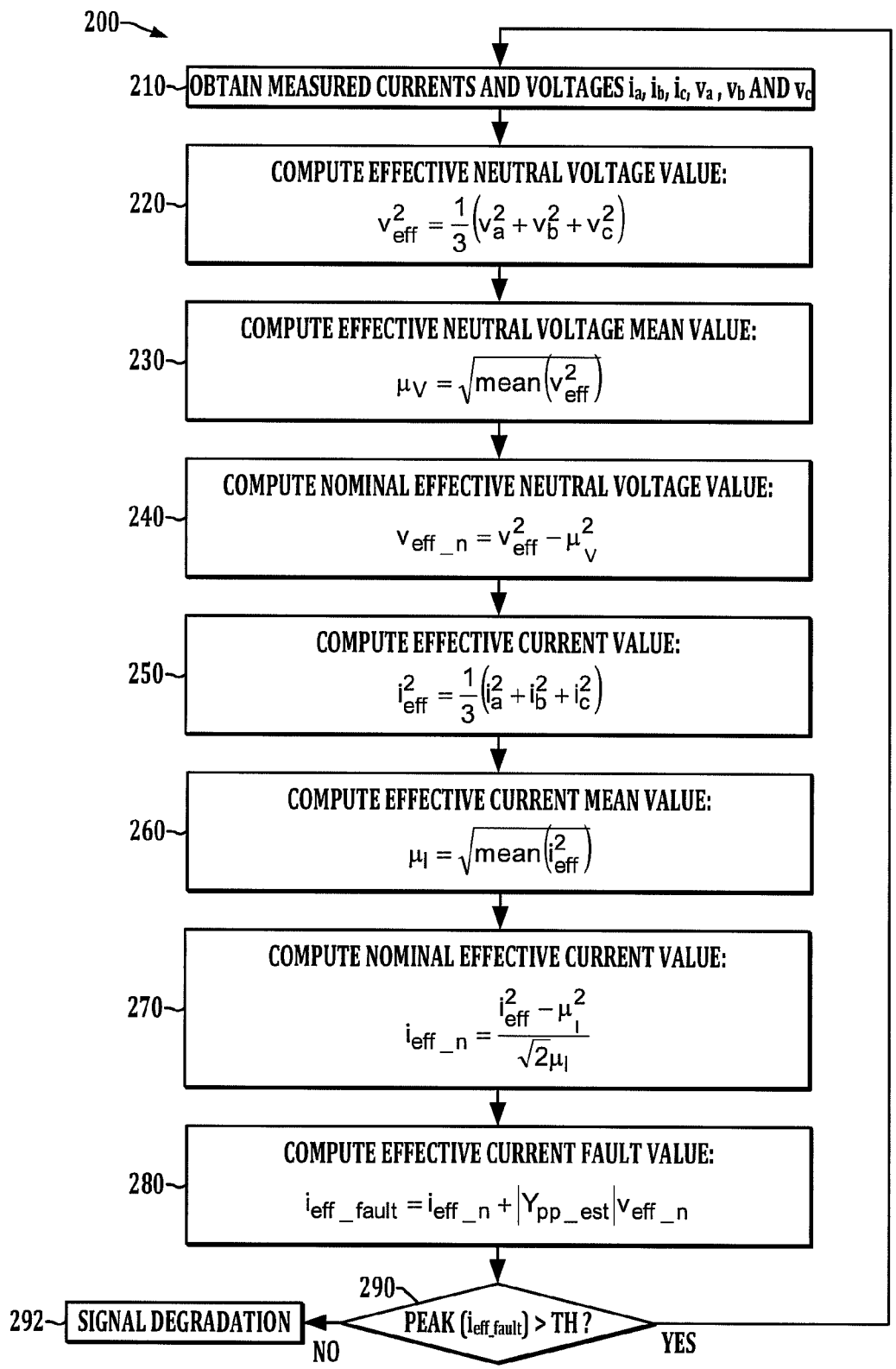
FIG. 9 is a flow diagram illustrating a scalar-based process for detecting filter capacitor degradation in a power conversion system in accordance with further aspects of the present disclosure.

Referring now to FIG. 9, a scalar-based approach may be employed in the degradation detection system 70 of FIGS. 1-4 above, wherein FIG. 9 shows a process 200 for detecting filter capacitor degradation in the input filter 20 which may be implemented by the system 70. The following equations (40)-(46) illustrate various measured voltages va, vb and currents ia, ib associated with operation of the filter circuit 20 (whether an LC filter or an LCL filter, and whether a Y-connected or a delta-connected configuration).

$$v_a = \sqrt{2}V_p\cos(\omega t+\theta_o)+\sqrt{2}V_n\cos(\omega t+\phi) \quad (40)$$

$$v_b = \sqrt{2}V_p\cos(\omega t+\theta_o-2\pi/3)+\sqrt{2}V_n\cos(\omega t+\phi+2\pi/3) \quad (41)$$

$$i_a = \sqrt{2}I_p\cos(\omega t+\theta_o+\pi/2)+\sqrt{2}I_n\cos(\omega t+\phi+\pi/2)+\sqrt{2}I'_n\cos(\omega t+\theta_o+\gamma) \quad (42)$$

$$i_b = \sqrt{2}I_p\cos(\omega t+\theta_o+\pi/2-2\pi/3)+\sqrt{2}I_n\cos(\omega t+\phi+\pi/2+2\pi/3)+\sqrt{2}I'_n\cos(\omega t+\theta_o+\gamma+2\pi/3) \quad (43)$$

$$I_p = |Y_{pp}|V_p \quad (44)$$

$$I_n = |Y_{nn}|V_n \quad (45)$$

$$I'_n = |Y_{np}|V_p \quad (46)$$

The inventors have appreciated that the line-line voltages are measured, and since common mode voltage can be ignored in many cases, line-neutral voltages can be determined according to the following equation (47):

$$v_a = \frac{1}{3}(v_{ab} - v_{ca}) \quad (47)$$

In addition, the positive sequence current $I_p$ is due to $V_p$ ($Y_{pp}$), and the negative sequence current $I_n$ is due to $V_n$ ($Y_{nn}$)

and $I_n'$ is due to $V_p$ ($Y_{np}$), where the effect of negative-sequence voltage on positive-sequence current can be neglected in certain embodiments.

In FIG. 9, the measured currents and voltages are obtained at 210, and an effective neutral voltage value is computed at 220 according to the following equation (48):

$$v_{eff}^2 = \frac{1}{3}(v_a^2 + v_b^2 + v_c^2) = V_p^2 + V_n^2 + 2V_pV_n\cos(2\omega t + 2\theta_o + \phi) \quad (48)$$

An effective neutral voltage mean value is computed at 230 according to the following equation (49):

$$\mu_V = \sqrt{\text{mean}(v_{eff}^2)} = \sqrt{V_p^2 + V_n^2} \sim V_p \quad (49)$$

At 240, a nominal effective neutral voltage value is computed according the following equation (50):

$$v_{eff\_n} = v_{eff}^2 - \mu_v^2 = 2V_pV_n\cos(2\omega t + 2\theta_o + \phi) \quad (50)$$

Similarly, a nominal effective current value is computed at 250, 260 and 270 in FIG. 9, according the following equations (51)-(53), by computation of an effective current value (equation (51)), an effective current mean value (equation (52)) and the nominal effective current value (equation (53)):

$$i_{eff}^2 = \frac{1}{3}(i_a^2 + i_b^2 + i_c^2) = I_p^2 + I_n^2 + I_n'^2 - 2I_pI_n\cos(2\omega t + 2\theta_p + \phi) + \quad (51)$$
$$2I_pI_n'\cos(2\omega t + 2\theta_o + \pi/2 + \gamma) - 2I_nI_n'\cos(\phi + \pi/2 - \theta_o - \gamma)$$

$$\mu_I = \sqrt{\text{mean}(i_{eff}^2)} \sim I_p \quad (52)$$

$$i_{eff\_n} = \frac{i_{eff}^2 - \mu_I^2}{\sqrt{2}\,\mu_I} = \quad (53)$$
$$-\sqrt{2}\,I_n\cos(2\omega t + 2\theta_o + \phi) + \sqrt{2}\,I_n'\cos(2\omega t + 2\theta_o + \pi/2 + \gamma)$$

The inventors have appreciated that the cosine term in the effective voltage equation (50) and the first cosine term in the effective current equation (53) are related to voltage unbalance conditions in the filter circuit 20, while the last term in the effective current equation (50) is related to capacitor unbalance conditions in the filter circuit 20. Accordingly, the system 7 computes an effective current fault value ($i_{eff\_fault}$) at 280 in FIG. 9 based on the nominal effective current value ($i_{eff\_n}$), an estimated admittance value ($|Y_{pp\_est}|$), and the nominal effective neutral voltage value ($v_{eff\_n}$), according to the following equation (54):

$$i_{eff\_fault} = i_{eff\_n} + |Y_{pp\_est}|v_{eff\_n} \approx \sqrt{2}\,|Y_{np\_est}|V_p\cos(2\omega t + 2\theta_o + \pi/2 + \gamma) \quad (54)$$

In addition, the system 70 compares the peak value of the effective current fault value $i_{eff\_fault}$ to at least one threshold at 290, and selectively detects degradation of one or more of the filter capacitors at 292 in FIG. 9 if the effective current fault value $i_{eff\_fault}$ exceeds the threshold. The peak-peak value of ieff_fault can thus be used to determine the magnitude of $Y_{np}$. The inventors have further appreciated that when inherent asymmetry exists, the magnitude of $Y_{np}$ can be estimated under normal conditions, and when capacitor degradation occurs, the magnitude (and phase) of $Y_{np}$ will change, wherein $$|Y_{pp\_est}| = \frac{I_p}{V_p} = |Y_{nn\_est}|.$$

The process 200 advantageously presents a computationally efficient scalar-based technique based on sequence components, which is capable of detecting capacitor degradation conditions, despite the inability to determine an exact value for the off-diagonal admittance matrix value $Y_{np}$. Without wishing to be tied to any particular theory, it is believed that since a degradation situation will create asymmetry much higher than what is expected nominally, the scalar method will work well in practice, and a given degradation system 70 may employ one or both of the techniques 100 and/or 200 in various embodiments.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:
1. A power conversion system, comprising:
an active front end rectifier, comprising a multiphase AC input, and a plurality of switching devices operative according to a plurality of rectifier switching control signals to convert power received at the multiphase AC input to provide DC output power;
an input filter circuit coupled between a power converter input and the active front end rectifier, the input filter circuit comprising a plurality of filter inductors coupled between a corresponding phase of the power converter input and a corresponding phase of the multiphase AC input of the active front end rectifier, and a capacitor circuit including a plurality of filter capacitors individually connected to at least one of the plurality of filter inductors;
a sensing circuit operative to determine a plurality of measured currents and measured voltages associated with the input filter circuit; and
a degradation detection system operatively coupled with the input filter circuit and comprising at least one processor configured to:
compute fundamental frequency current and voltage phasors based on the measured currents and voltages, compute positive and negative sequence current and voltage component phasors based on the computed fundamental frequency current and voltage phasors, compute at least one off-diagonal term of a filter circuit admittance matrix based on at least one of the computed positive and negative sequence current and voltage component phasors, compare the at least one off-diagonal term to at least one threshold, and selectively detect degradation of one or more of the filter capacitors if the at least one off-diagonal term exceeds the at least one threshold.

2. The power conversion system of claim 1, wherein the sensing circuit is operative to determine a plurality of measured capacitor bank branch line currents and measured line-line voltages associated with the input filter circuit, and wherein the at least one processor is configured to compute the fundamental frequency current and voltage phasors based on the plurality of measured capacitor bank branch line currents and measured line-line voltages.

3. The power conversion system of claim 1, wherein the at least one processor is configured to compute an adjusted off-diagonal term by offsetting the at least one off-diagonal term of the filter circuit admittance matrix based on a predetermined nominal asymmetry value, to compare the adjusted off-diagonal term to the at least one threshold, and to selectively detect degradation of one or more of the filter capacitors if the adjusted off-diagonal term exceeds the at least one threshold.

4. The power conversion system of claim 1, wherein the at least one processor is configured to compute the at least one off-diagonal term of the filter circuit admittance matrix as an off-diagonal term of the filter circuit admittance matrix representing an effect of positive sequence voltage on negative sequence current in the input filter circuit.

5. The power conversion system of claim 4, wherein the at least one processor is configured to compute the off-diagonal term $\hat{Y}_{np}$ of the filter circuit admittance matrix representing the effect of positive sequence voltage on negative sequence current in the input filter circuit based on a positive sequence current phasor $\tilde{I}_p$, a negative sequence current phasor $\tilde{I}_n$, a positive sequence voltage phasor $\tilde{V}_p$, and a negative sequence voltage phasor $\tilde{V}_n$ according to the following formula:

$$\hat{Y}_{np} = \frac{\tilde{I}_n - \frac{\tilde{I}_p}{\tilde{V}_p}\tilde{V}_n}{\tilde{V}_p}.$$

6. The power conversion system of claim 1, wherein the at least one processor is configured to:

determine individual impedance values for the plurality of filter capacitors, and to identify at least one particular filter capacitor as being suspected of degradation based on the corresponding determined impedance value.

7. The power conversion system of claim 6:

wherein the plurality of filter capacitors are connected in a delta configuration;

wherein the at least one processor is configured to determine individual impedance values for the plurality of filter capacitors by:

computing line-neutral admittance matrix elements and line-line positive and negative sequence current and voltage component phasors based on line-neutral positive and negative sequence current and voltage component phasors, computing line-line admittance matrix components based on the line-neutral admittance matrix components, computing a zero sequence circulating current phasor based on at least some of the line-line admittance matrix components, and computing individual Delta line-line impedance values for at least some of the filter capacitors; and wherein the at least one processor is configured to identify at least one particular filter capacitor as being suspected of degradation by:

comparing individual Delta line-line impedance values with the at least one threshold value, and identifying at least one of the filter capacitors as being suspected of degradation if a corresponding Delta line-line impedance value exceeds the at least one threshold value.

8. The power conversion system of claim 6:

wherein the plurality of filter capacitors are connected in a Y configuration;

wherein the at least one processor is configured to determine individual impedance values for the plurality of filter capacitors by:

computing a line-neutral admittance matrix based on line-neutral positive and negative sequence current and voltage component phasors, computing a line-neutral impedance matrix by inverting the line-neutral admittance matrix, computing line-neutral positive and negative sequence voltage component phasors based online-line positive and negative sequence voltage component phasors, computing a neutral zero sequence voltage phasor based on at least some line-neutral impedance matrix components and the computed line-neutral positive and negative sequence voltage component phasors, and computing individual Y line-neutral impedance values for at least some of the filter capacitors based on the line-neutral positive and negative sequence current and voltage component phasors and the computed neutral zero sequence voltage phasor; and wherein the at least one processor is configured to identify at least one particular filter capacitor as being suspected of degradation by:

comparing the individual Y line-neutral impedance values with the at least one threshold value, and identifying at least one of the filter capacitors as being suspected of degradation if a corresponding Y line-neutral impedance values exceeds the at least one threshold value.

9. A method for detecting filter capacitor degradation in an input filter of an active front end power conversion system, the method comprising:

determining a plurality of measured currents and measured voltages associated with the input filter circuit;

computing fundamental frequency current and voltage phasors based on the measured currents and voltages;

computing positive and negative sequence current and voltage component phasors based on the computed fundamental frequency filter current and voltage phasors;

computing at least one off-diagonal term of a filter circuit admittance matrix based on at least one of the computed positive and negative sequence current and voltage component phasors;

comparing the at least one off-diagonal term to at least one threshold; and
selectively detecting degradation of one or more of the filter capacitors if the at least one off-diagonal term exceeds the at least one threshold.

10. The method of claim 9, comprising:
computing an adjusted off-diagonal term by offsetting the at least one off-diagonal term for of the filter circuit admittance matrix based on a predetermined nominal asymmetry value;
comparing the adjusted off-diagonal term to the at least one threshold; and
selectively detecting degradation of one or more of the filter capacitors if the adjusted off-diagonal term exceeds the at least one threshold.

11. The method of claim 9, comprising:
determining individual impedance values for the plurality of filter capacitors; and
identifying at least one particular filter capacitor as being suspected of degradation based on a corresponding determined impedance value.

12. The method of claim 11:
wherein the plurality of filter capacitors are connected in a delta configuration;
wherein determining the individual impedance values for the plurality of filter capacitors comprises:
computing line-neutral admittance matrix elements and line-line positive and negative sequence current and voltage component phasors based on line-neutral positive and negative sequence current and voltage component phasors,
computing line-line admittance matrix components based on the line-neutral admittance matrix components,
computing a zero sequence circulating current phasor based on at least some of the line-line admittance matrix components, and
computing individual Delta line-line impedance values for at least some of the filter capacitors; and
wherein identifying at least one particular filter capacitor as being suspected of degradation comprises:
comparing individual Delta line-line impedance values with the at least one threshold value, and
identifying at least one of the filter capacitors as being suspected of degradation if a corresponding Delta line-line impedance value exceeds the at least one threshold value.

13. The method of claim 11:
wherein the plurality of filter capacitors are connected in a Y configuration;
wherein determining the individual impedance values for the plurality of filter capacitors comprises:
computing a line-neutral admittance matrix based on line-neutral positive and negative sequence current and voltage component phasors,
computing a line-neutral impedance matrix by inverting the line-neutral admittance matrix,
computing line-neutral positive and negative sequence voltage component phasors based online-line positive and negative sequence voltage component phasors,
computing a neutral zero sequence voltage phasor based on at least some line-neutral impedance matrix components and the computed line-neutral positive and negative sequence voltage component phasors, and
computing individual Y line-neutral impedance values for at least some of the filter capacitors based on the line-neutral positive and negative sequence current and voltage component phasors and the computed neutral zero sequence voltage phasor; and
wherein identifying at least one particular filter capacitor as being suspected of degradation comprises:
comparing the individual Y line-neutral impedance values with the at least one threshold value, and
identifying at least one of the filter capacitors as being suspected of degradation if a corresponding Y line-neutral impedance values exceeds the at least one threshold value.

14. A power conversion system, comprising:
an active front end rectifier, comprising a multiphase AC input, and a plurality of switching devices operative according to a plurality of rectifier switching control signals to convert power received at the multiphase AC input to provide DC output power;
an input filter circuit coupled between the power converter input and the active front end rectifier, the input filter circuit comprising a plurality of filter inductors coupled between a corresponding phase of the power converter input and a corresponding phase of the multiphase AC input of the active front end rectifier, and a capacitor circuit including a plurality of filter capacitors individually connected to at least one of the plurality of filter inductors;
a sensing circuit operative to determine a plurality of measured currents and measured voltages associated with the input filter circuit; and
a degradation detection system operatively coupled with the input filter circuit and comprising at least one processor configured to:
compute an effective neutral voltage value based on the measured voltages,
compute an effective neutral voltage mean value based on the effective neutral voltage value,
compute a nominal effective neutral voltage value based on the effective neutral voltage value and the effective neutral voltage mean value,
compute an effective current value based on the measured currents,
compute an effective current mean value based on the effective current value,
compute a nominal effective current value based on the effective current value and the effective current mean value,
compute an effective current fault value based on the nominal effective current value, an estimated admittance value, and the nominal effective neutral voltage value,
compare the effective current fault value to at least one threshold, and
selectively detect degradation of one or more of the filter capacitors if the effective current fault value exceeds the at least one threshold.

15. The power conversion system of claim 14, wherein the sensing circuit is operative to determine a plurality of measured capacitor bank branch line currents and measured line-line voltages associated with the input filter circuit, and wherein the at least one processor is configured to compute the effective neutral voltage value based on the measured line-line voltages and to compute the effective current value based on the measured capacitor bank branch line currents.

16. A method for detecting filter capacitor degradation in an input filter of an active front end power conversion system, the method comprising:
determining a plurality of measured currents and measured voltages associated with the input filter circuit;

computing an effective neutral voltage value based on the measured voltages, computing an effective neutral voltage mean value based on the effective neutral voltage value, computing a nominal effective neutral voltage value based on the effective neutral voltage value and the effective neutral voltage mean value, computing an effective current value based on the measured currents, computing an effective current mean value based on the effective current value, computing a nominal effective current value based on the effective current value and the effective current mean value, computing an effective current fault value based on the nominal effective current value, an estimated admittance value, and the nominal effective neutral voltage value, comparing the effective current fault value to at least one threshold, and selectively detecting degradation of one or more of the filter capacitors if the effective current fault value exceeds the at least one threshold.

17. The method of claim 16, comprising:

determining a plurality of measured capacitor bank branch line currents and measured line-line voltages associated with the input filter circuit;

computing the effective neutral voltage value based on the measured line-line voltages; and computing the effective current value based on the measured capacitor bank branch line currents.

* * * * *